Oct. 13, 1964 N. SZEREMY 3,153,198
TONE CONTROL FOR A LOCKED OSCILLATOR DETECTOR CIRCUIT
Filed Sept. 7, 1962
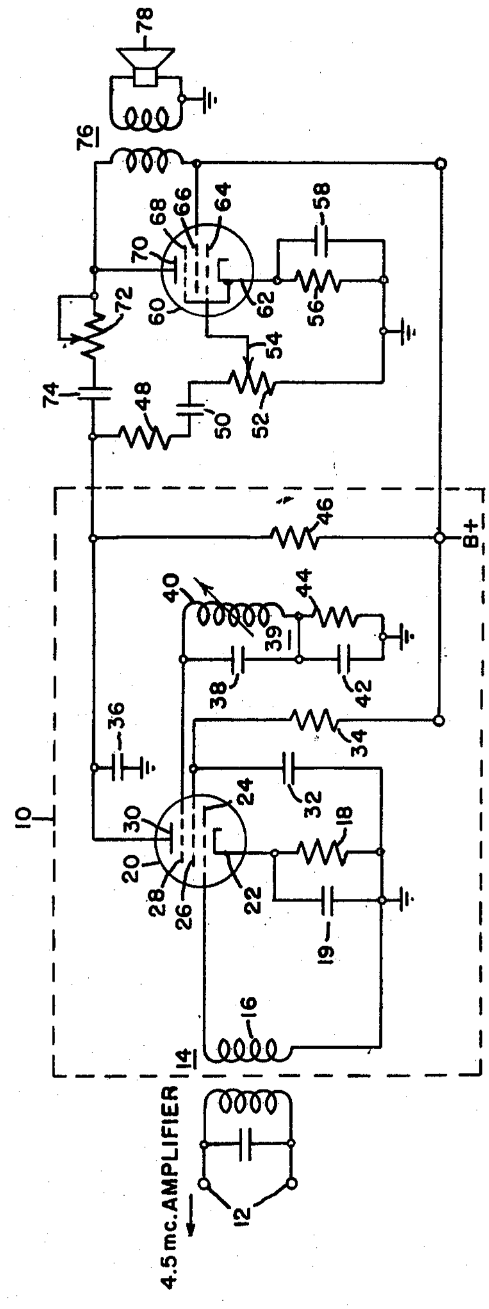
INVENTOR:
NORMAN SZEREMY,
BY Joseph Levinson
HIS ATTORNEY.

United States Patent Office 3,153,198
Patented Oct. 13, 1964

3,153,198

TONE CONTROL FOR A LOCKED OSCILLATOR DETECTOR CIRCUIT

Norman Szeremy, Syracuse, N.Y., assignor to General Electric Company, a corporation of New York Filed Sept. 7, 1962, Ser. No. 222,118
5 Claims. (Cl. 325—424)

This invention relates to a tone control, and more particularly to a tone control utilized in a locked oscillator type detector circuit.

Locked oscillator detectors employing sharp cut-off pentodes have been utilized in the sound systems of television receivers. The sharp cut-off pentode combines the functions of a limiter, discriminator and audio amplifier in a single tube. The locked oscillator detector circuit has a performance which is comparable to other FM detectors besides having the advantage of simplicity due to the multiple functions combined in a single tube. In providing tone controlling for such a detector, the most commonly used arrangement includes a series combination of a capacitor and a variable resistor that are connected between the plate of an audio output tube which is fed the output from the locked oscillator tube and the A.C. chassis. The drawback of this particular circuit is that it requires that the series resistor-capacitor combination be a relatively low impedance since it is connected in parallel with a relatively low impedance circuit. This requires the use of a relatively large oil filled paper capacitor of high voltage rating.

It is an object of this invention to provide a new and inexpensive circuit for accomplishing the function of tone control for a locked oscillator detector which eliminates the need for a high cost capacitor of the type previously utilized.

Another circuit which has been utilized for providing the tone control function for a locked oscillator type detector utilizes a variable resistor-capacitor combination which is connected in series between the plate of the locked oscillator pentode and ground. This arrangement suffers the disadvantage of causing a change in load impedance for the locked oscillator pentode thereby deteriorating the performance of the locked oscillator detector.

Accordingly, it is a further object of this invention to provide a novel tone control for a locked oscillator detector which does not deteriorate the operating characteristics of the locked oscillator detector.

Another object of this invention is to provide a tone control circuit for a locked oscillator detector which overcomes the disadvantages of the previously described arrangements in a simple and economical manner.

In carrying out this invention in one illustrative embodiment thereof, a series connected variable resistor and capacitor is essentially coupled between the plate of an audio output tube and the anode of the locked oscillator tube. This arrangement provides a frequency dependent negative feedback circuit which is variable and does not disturb the operation of the locked oscillator circuit. The negative feedback permits the use of a smaller, inexpensive type capacitor which significantly reduces the cost of the tone control for the locked oscillator.

The invention, both as to organization and method of operation, together with further objects and advantages thereof, may best be understood by reference to the following description taken in connection with the accompanying drawing which is a schematic diagram of the novel tone control for a locked oscillator detector in accordance with the invention.

Referring now to the drawing, a locked oscillator quadrature grid detector which is referred to as a locked oscillator detector is designated generally with the character reference 10. The locked oscillator 10 has a pair of input terminals 12 which are coupled to a 4.5 megacycle amplifier (not shown) which applies an FM signal via a transformer 14 having a secondary winding 16 to a sharp cut-off pentode 20. The pentode 20 has a cathode 22, a control grid 24, a screen grid 26, a suppressor or a second control grid 28 and an anode 30. The 4.5 megacycle FM signal is applied from the secondary winding 16 to the first control grid 24 of the pentode 20. The cathode 22 is connected by a cathode bias resistor 18 to ground and is by-passed by a by-pass capacitor 19. A source of B+ potential is applied via a resistor 34 to the screen grid 26 and the screen grid 26 is by-passed to ground for the 4.5 megacycle signal and detected output signals via a by-pass capacitor 32. A quadrature circuit 39 comprising a variable inductor 40 and a capacitor 38, which is tuned to the center frequency of the 4.5 megacycle input signal, is coupled to the second control grid 28 of the pentode 20. The quadrature circuit 39 is connected to ground through a bias resistor 44 which is by-passed by a capacitor 42. The time constant of the resistor 44 and capacitor 42 is large enough to provide a small direct current bias on the second control grid 28. A source of B+ potential is applied via a load resistor 46 to the anode 30 of the pentode 20. A deemphasis network is provided by a by-pass capacitor 36 which is connected between the anode 30 of pentode 20 and ground.

A brief description of the operation of the locked oscillator 10 follows. Output from the 4.5 megacycle amplifier is fed to the first control grid 24 of the pentode 20 through a double-tuned interstage transformer 14. These input signals pass from the first control grid 24 to the second control grid 28 by way of interelectrode capacity coupling with a resulting phase shift due to the capacitive coupling. This phase difference is 90° when the input signal is unmodulated because the quadrature coil 40 in the second control grid circuit is tuned to resonate at the 4.5 megacycle center frequency of the input circuit. As the incoming signal varies at an audio rate with modulation, the resonant condition between the control grid 24 and the quadrature circuit 39 change at the same rate. Accordingly, the phase differential between the two circuits varies at an audio rate. Since the anode current of the pentode 20 varies with the combined effect of the first control grid 24 and the second control grid 28 voltages, these audio rate changes in phase relationship produce demodulation to produce an audio output at the anode 30 of pentode 20.

During the reception of weak signals, the pentode 20 and its associated circuitry functions similarly to a tuned-grid, tuned-plate oscillator capable of linear deviation by relatively small input signals. This so-called "locked oscillator" action results from a feedback voltage between the second control grid 28 and the first control grid 24 because of interelectrode capacity. At normal or higher signal levels, this feedback is blocked due to larger current in the control grid 24 circuit. A limiting action is provided in the circuit by adjusting the voltage on the screen grid 26. At low signal levels AM rejection is no problem and at higher signal levels AM rejection is maintained by degeneration in the cathode circuit of the pentode 20.

The audio output stage as shown in the drawing includes an audio output tube 60 having a cathode 62, a control grid 64, a screen grid 66, and a suppressor grid 68 which is connected to the cathode 62 and an anode 70. The output of the locked oscillator detector 10 appearing across load resistor 46 is coupled via an anti-tweet resistor 48, a coupling capacitor 50 and a volume control potentiometer 52 having a tap 54 which applies the output of the detector 10 to the control grid 64 of tube 60. The cathode 62 is connected through a bias resistor 56 which is by-passed by a capacitor 58 to ground. A source of B+ is applied to the screen grid 66 and through the primary winding of a transformer 76 to the anode 70 of the tube 60. A loudspeaker 78 is coupled to the anode circuit of the tube 60 by the transformer 76. A negative feedback circuit consisting of a variable resistor 72 and a coupling capacitor 74 is coupled between the anode 70 and the resistor 48.

The audio output stage 60 functions in a conventional manner to amplify the detected signals from the locked oscillator 10 and apply them to the loudspeaker 78. The volume thereof may be adjusted by adjusting the tap 54 of the volume control 52. Tone control is achieved by the negative feedback circuit between the anode 70 and the grid 64 via the variable resistor 72 and capacitor 74. The feedback circuit is frequency dependent and feeds back a greater portion of high frequency signals from the anode than low frequencies. Accordingly, the circuit functions to attenuate more high frequencies than low frequencies to provide a suitable tone control. The feedback circuit is a high impedance circuit so it will not interfere with the operation of the locked oscillator circuit 10. Although intercoupling the feedback circuit through the volume control 52 provides some interplay between the two, this feature does not prove too objectionable because of the nature of the locked oscillator detector which produces a fairly constant signal for both low and high level signals.

By way of example only, one set of parameters for the tone control which have been found satisfactory are as follows:

| | | |
|---|---|---|
| Resistor **72** | megohms | 5 |
| Capacitor **74** | micromicrofarads | 500 |
| Resistor **48** | ohms | 2.2K |
| Capacitor **50** | mmf | .02 |
| Potentiometer **52** | megohms | .5 |
| Resistor **56** | ohms | 220 |
| Capacitor **58** | microfarads | 25 |

Several variations using a negative feedback path are possible. Such variations would primarily differ in a connection of the feedback path to a point of lower signal level in the circuit. For example, the feedback path may be connected between the anode 70 and the upper end of the volume control 52. A negative feedback path still exists between the audio output and the locked oscillator output. The negative feedback approach for tone controlling offers a very simple and economical method of obtaining a tone control for a locked oscillator type detector which does not deteriorate the performance of such a detector.

Since other modifications and changes varied to fit particular operating requirements and environments will be apparent to those skilled in the art, this invention is not considered limited to the examples chosen for purposes of disclosure and covers all changes and modifications which do not constitute departures from the true spirit and scope of this invention.

What I claim as new and desire to secure by Letters Patent of the United States is:

1. A tone control for a locked oscillator quadrature grid detector comprising a locked oscillator quadrature grid detector having an input and an output, said detector having means for receiving at said input an FM signal and delivering to said output a detected FM signal, an audio output stage having an input and an output, means for coupling said output of said detector with the input of said audio output stage, a frequency dependent negative feedback circuit coupled between the output of said detector and the output of said audio output stage.

2. A tone control for a locked oscillator quadrature grid detector comprising a locked oscillator quadrature grid detector for detecting an FM signal to provide an audio output therefrom, said detector having a pentode tube with an anode on which said audio output exists, an audio output amplifier including at least a control electrode and an anode electrode, means for coupling the anode of said pentode tube with the control electrode of said audio output amplifier, a frequency dependent negative feedback circuit coupled between the anode of said audio output amplifier and said anode of said pentode tube.

3. The structure set forth in claim 2 wherein said feedback circuit comprises a variable resistor and a capacitor which are serially connected.

4. A tone control for a locked oscillator quadrature grid detector comprising a locked oscillator quadrature grid detector for detecting an FM signal to provide an audio output therefrom, said detector having a pentode tube with an anode on which said audio output exists, an audio output amplifier including at least a control electrode, and an anode electrode, means including a volume control potentiometer for coupling the anode of said pentode tube with the control electrode of said audio output amplifier, a frequency dependent negative feedback circuit coupled between the anode of said audio output amplifier and said volume control potentiometer.

5. In combination a locked oscillator quadrature grid frequency modulation detector having an input and an output, an audio output amplifier having an input and an output, means coupling the output of said detector to the input of said amplifier, and a variable frequency dependent negative feedback circuit connected between the output and input of said amplifier so as to provide a tone control for the audio signals appearing at the output of said amplifier.

References Cited in the file of this patent

UNITED STATES PATENTS 2,874,277 Orr ---------- Feb. 17, 1959